(12) United States Patent
Hatori

(10) Patent No.: US 6,836,497 B1
(45) Date of Patent: Dec. 28, 2004

(54) SEMICONDUCTOR LASER MODULE AND METHOD FOR FORMING SEMICONDUCTOR LASER MODULE

(75) Inventor: Masami Hatori, Kanagawa (JP)

(73) Assignee: Fuji Photo Film Co., Ltd., Kanagawa (JP)

( * ) Notice: Subject to any disclaimer, the term of this patent is extended or adjusted under 35 U.S.C. 154(b) by 0 days.

(21) Appl. No.: 09/533,678

(22) Filed: Mar. 23, 2000

(30) Foreign Application Priority Data

Mar. 31, 1999 (JP) ............................................ 11-093845

(51) Int. Cl.[7] ................................................. H01S 5/00
(52) U.S. Cl. ........................................ 372/43; 372/38
(58) Field of Search ............................... 372/43–50, 75, 372/38.02, 38.01, 32, 25, 36, 33; 359/326, 328, 332; 29/600; 438/31

(56) References Cited

U.S. PATENT DOCUMENTS

| | | | | |
|---|---|---|---|---|
| 5,113,469 A | * | 5/1992 | Hatakoshi et al. | 385/122 |
| 5,253,259 A | * | 10/1993 | Yamamoto et al. | 372/22 |
| 5,274,727 A | * | 12/1993 | Ito et al. | 385/122 |
| 5,359,452 A | * | 10/1994 | Nitanda et al. | 359/328 |
| 5,415,743 A | * | 5/1995 | Harada | 427/466 |
| 5,506,722 A | * | 4/1996 | Mizuuchi et al. | 359/326 |
| 5,652,674 A | * | 7/1997 | Mizuuchi et al. | 359/326 |
| 5,836,073 A | * | 11/1998 | Mizuuchi et al. | 29/600 |
| 5,838,486 A | * | 11/1998 | Sonoda et al. | 359/332 |
| 6,002,515 A | * | 12/1999 | Mizuuchi et al. | 359/326 |
| 6,151,342 A | * | 11/2000 | Nightingale et al. | 372/36 |
| 6,195,198 B1 | * | 2/2001 | Hatori | 359/332 |
| 6,261,858 B1 | * | 7/2001 | Kitaoka et al. | 438/31 |
| 6,298,075 B1 | * | 10/2001 | Kitaoka et al. | 372/33 |
| 6,323,990 B1 | * | 11/2001 | Yamamoto et al. | 359/328 |
| 6,327,289 B1 | * | 12/2001 | Kitaoka et al. | 372/50 |

FOREIGN PATENT DOCUMENTS

| | | | | |
|---|---|---|---|---|
| JP | | 5-289132 | 11/1993 | ............ G02F/1/37 |
| JP | | 10-506724 | 6/1998 | ............ G02F/1/37 |

* cited by examiner

Primary Examiner—Don Wong
Assistant Examiner—Tuan N. Nguyen
(74) Attorney, Agent, or Firm—Sughrue Mion, PLLC

(57) ABSTRACT

A semiconductor laser module is formed by directly bonding a semiconductor laser, which has a wavelength tuning mechanism, and an optical wavelength conversion element which exits laser beam of the second harmonic with the wavelength of the exited laser beam being the fundamental wave. A center wavelength of stimulated emission of the semiconductor laser is tunable, and is locked so as to coincide with a phase matching wavelength of the optical wavelength conversion element. The semiconductor laser and the optical wavelength conversion element are directly bonded together at an end surface portion of an optical wavelength of the optical wavelength conversion element.

25 Claims, 12 Drawing Sheets

F I G. 5 A
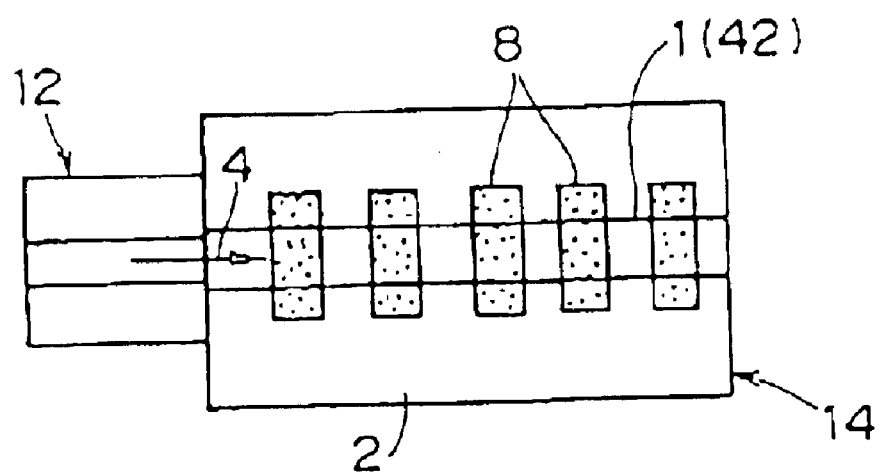
F I G. 5 B
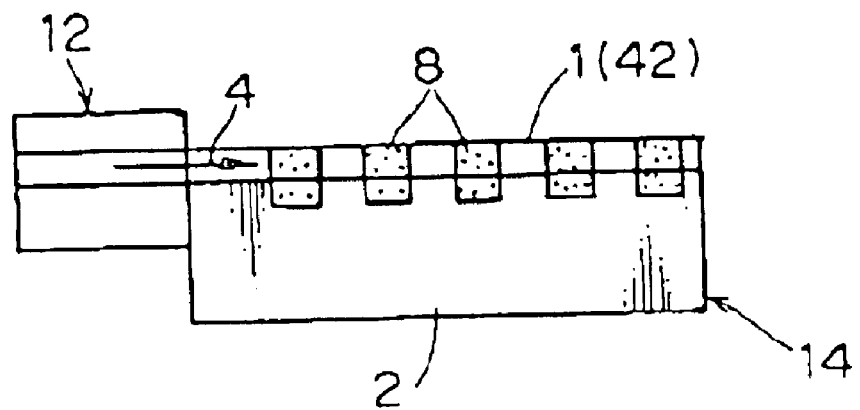

F I G. 6 A
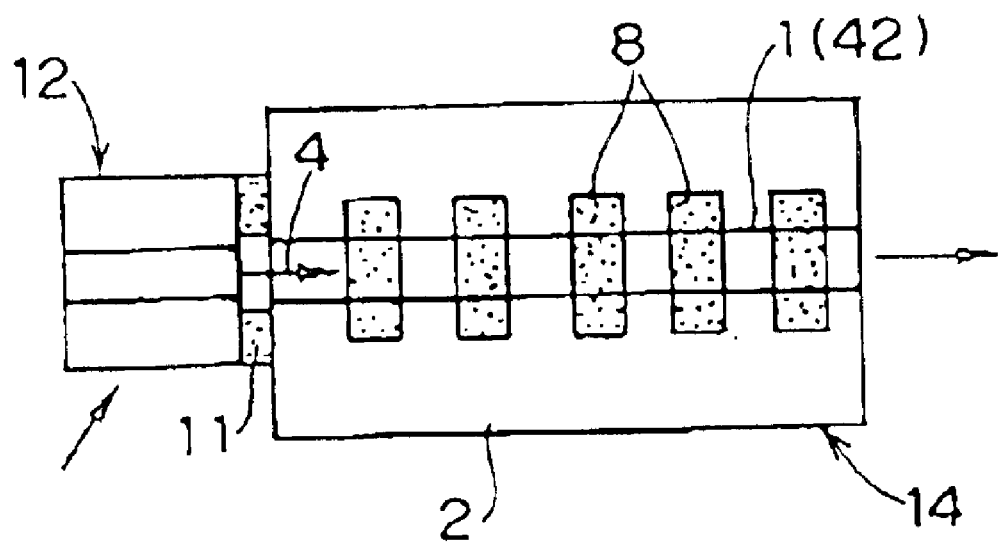
F I G. 6 B
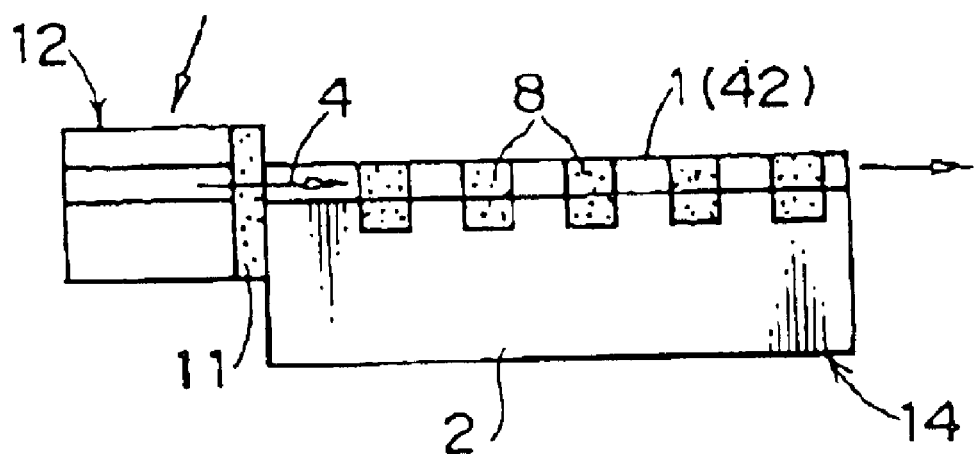

F I G. 7 A
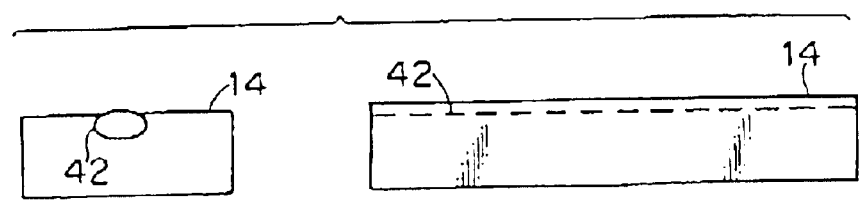
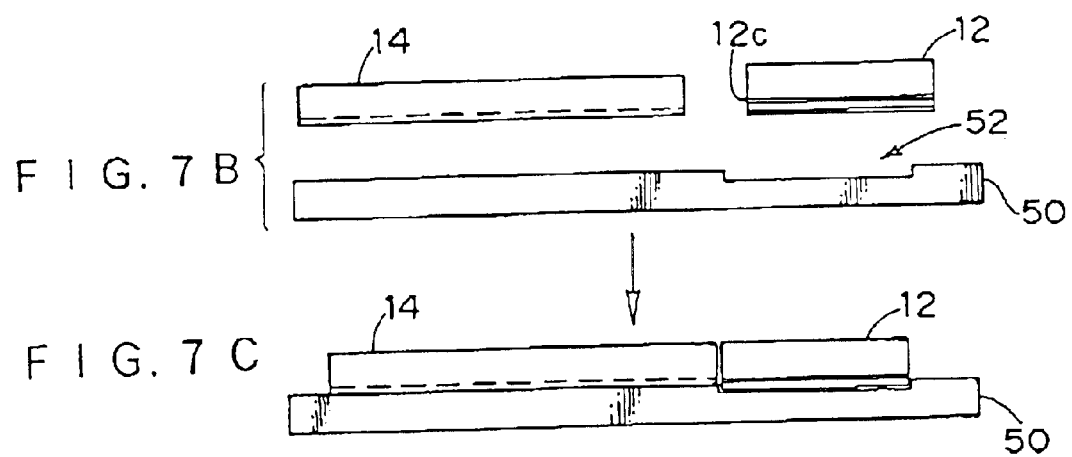
F I G. 7 B
F I G. 7 C

F I G. 8 A
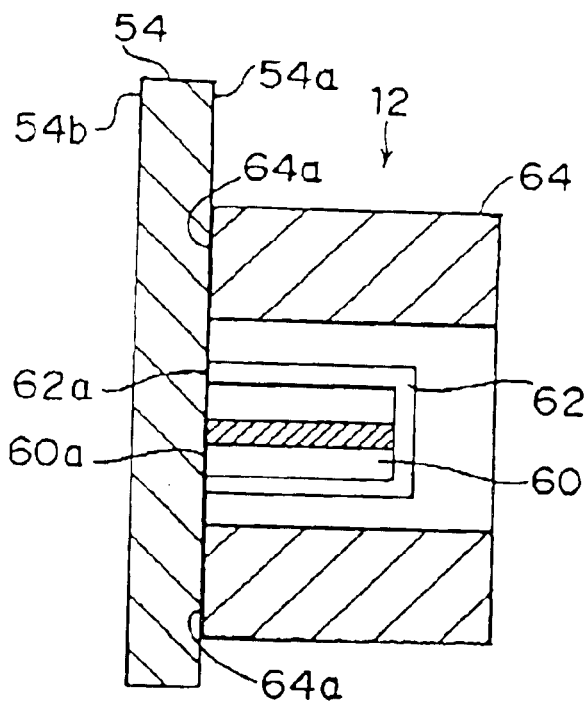
F I G. 8 B
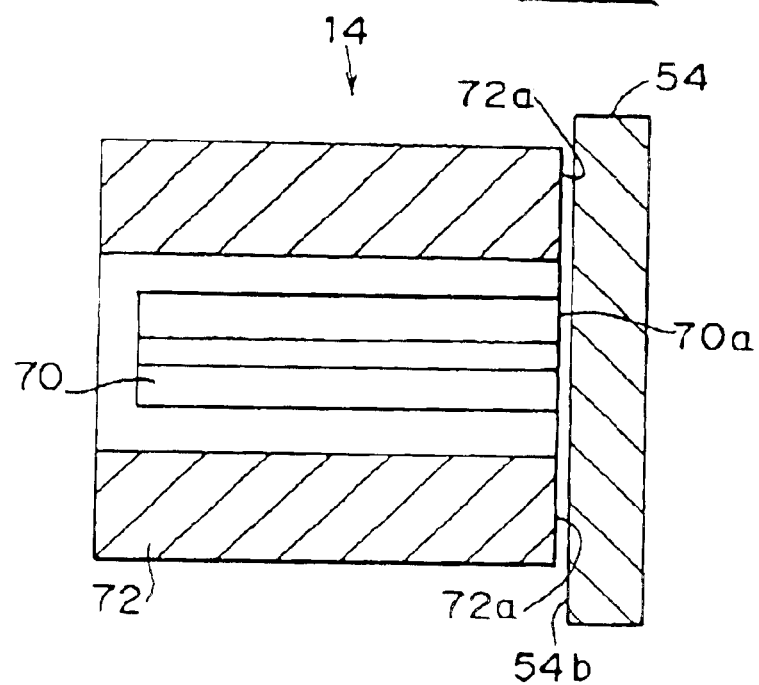

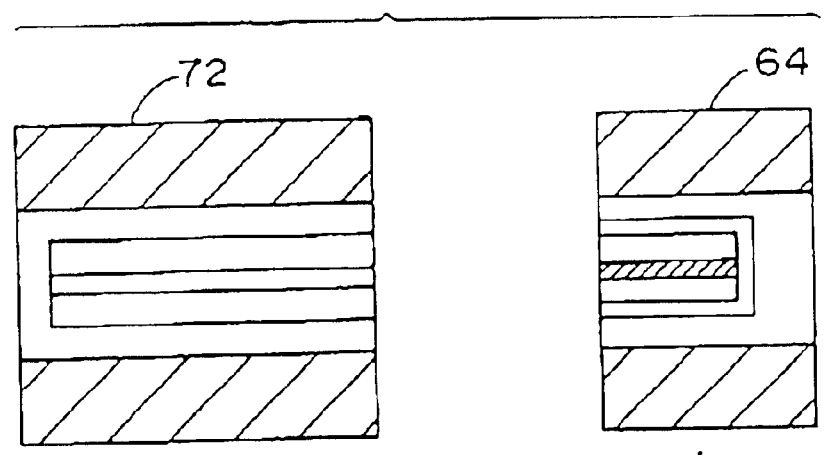
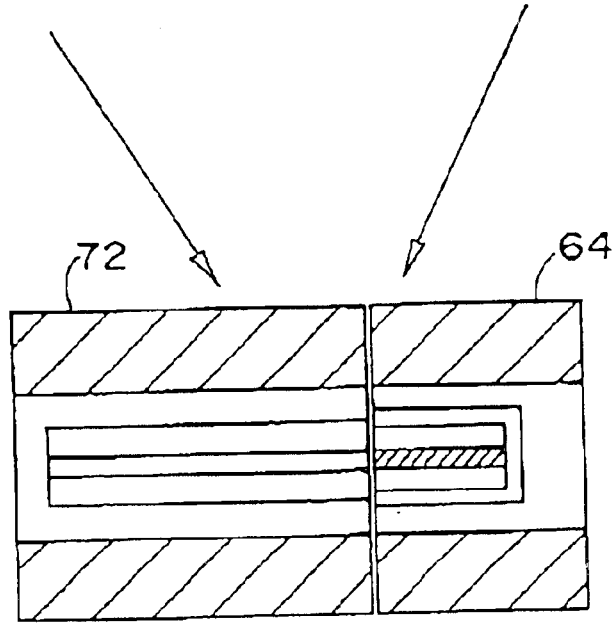
FIG. 10A
FIG. 10B

F I G. 1 1
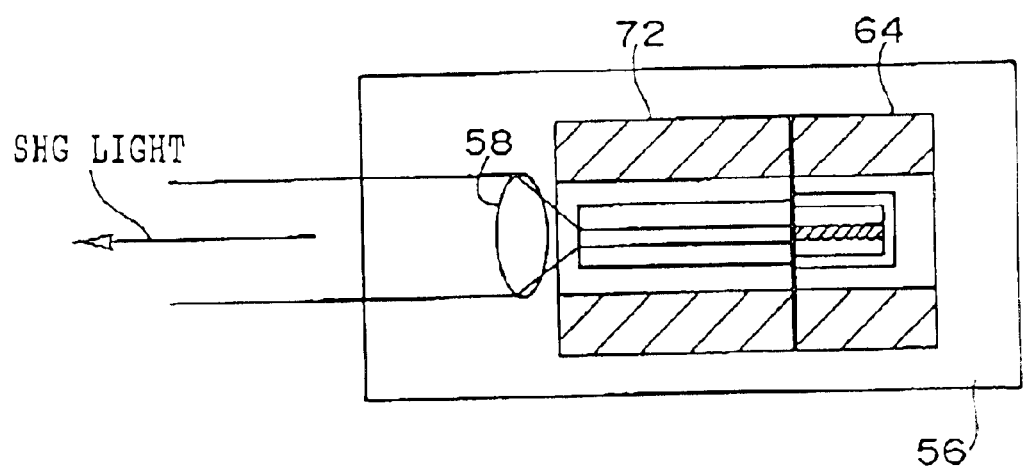

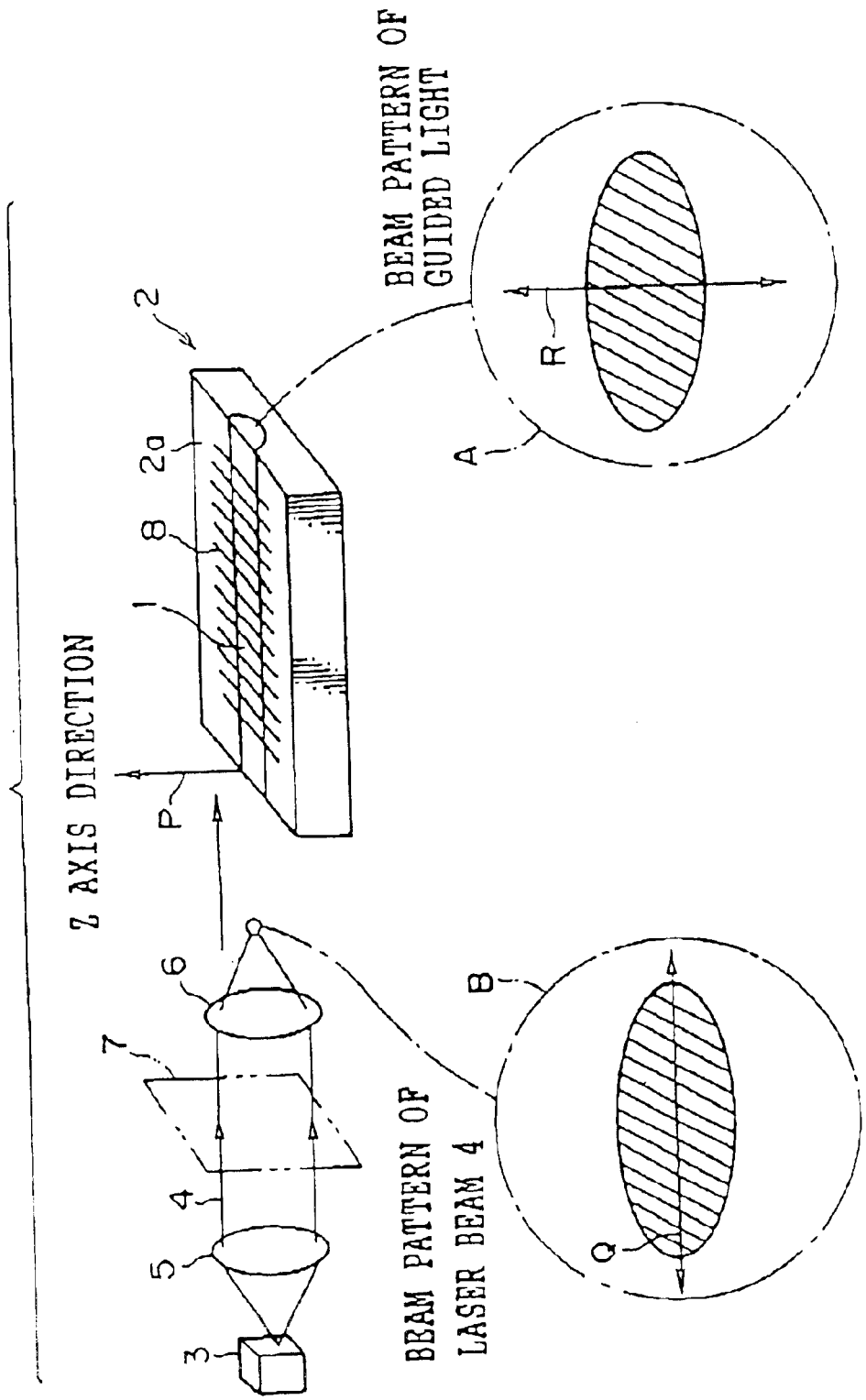

SEMICONDUCTOR LASER MODULE AND METHOD FOR FORMING SEMICONDUCTOR LASER MODULE

BACKGROUND OF THE INVENTION

1. Field of the Invention

The present invention relates to a semiconductor laser module and a method for forming the semiconductor laser module, and in particular, to a semiconductor laser module which converts an original center wavelength of stimulated emission of a semiconductor laser to emit a laser beam of a desired wavelength and a method for forming the semiconductor laser module.

2. Description of the Related Art

A method for converting a fundamental wave to a second harmonic by using an optical wavelength conversion element, in which a region where the spontaneous polarization (i.e., domain) of ferroelectrics having a non-linear optical effect is periodically inverted is provided, has been proposed by Bleombergen et al. (see Phys. Rev., Vol. 127, No. 6, 1918 (1962)). In accordance with this method, by setting the period $\Lambda$ of the domain inversion portion so as to be an integer multiple of the coherent length $\Lambda c$ defined by the following formula, phase matching (so-called pseudo phase matching) between the fundamental wave and the second harmonic can be carried out.

$$\Lambda c = 2\pi / \{\beta(2\omega) - 2\beta(\omega)\}$$

In this equation, $\beta(2\omega)$ is the propagation constant of the second harmonic and $\beta(\omega)$ is the propagation constant of the fundamental wave. Attempts have been made to carry out phase matching efficiently by forming such a periodic domain inversion structure in an optical waveguide type optical wavelength conversion element which converts the wavelength of the fundamental wave which propagates in an optical waveguide made of a non-linear optical material.

As one example, a conventional optical waveguide type optical wavelength conversion element, in which a periodic domain inversion structure is formed, is such that, as shown in FIG. 12, a spontaneous polarization direction of a substrate 2 shown by the arrow P is perpendicular to one substrate surface 2a (i.e., the substrate surface along which an optical waveguide 1 extends) (see Japanese Patent Application Laid-Open (JP-A) No. 5-29207).

In the above-described art, in order to carry out wavelength conversion efficiently, a Z-cut substrate of LiNbO$_3$, LiTaO$_3$ or the like is used as an optical element in art which uses a Z-cut substrate. In a voltage application method, when the periodic domain inversion region is formed, the inversion region tends to extend along the Z axis, and therefore, when using the Z-cut substrate, a deep periodic domain inversion structure can be formed. Accordingly, the periodic domain inversion structure is formed in the optical element and the optical waveguide is formed in a region where the periodic domain inversion structure is formed, and therefore, the wavelength conversion can be carried out with high efficiency.

In this optical wavelength conversion element, the domain inversion portion can be formed sufficiently deep from the substrate surface. However, in a case of using the optical wavelength conversion element with a semiconductor laser, an incident optical system of the fundamental wave becomes complicated. Namely, in the structure shown in FIG. 12, a beam pattern of the guided light is such that, as shown in the circle A in FIG. 12, a beam diameter in a direction parallel to the direction of the polarization vector shown by the arrow R is small and a beam diameter in a direction perpendicular to the direction is large. At this time, the direction of the polarization vector coincides with the spontaneous polarization direction of the substrate 2 (generally, in ferroelectrics such as LiNbO$_3$ or the like, the spontaneous polarization direction is parallel to the Z axis), and the guided mode is the TM mode. On the other hand, a beam pattern of a laser beam 4 emitted from a semiconductor laser 3 is such that, as shown in the circle B in FIG. 12, a beam diameter in the direction parallel to the direction of the polarization vector shown by the arrow Q is large and a beam diameter in a direction perpendicular to the direction is small. When respective polarization directions are aligned in order to input the laser beam 4 emitted from the semiconductor laser 3 into the optical waveguide 1, beam shapes are mismatched and therefore, the laser beam 4 cannot be entered efficiently into the optical waveguide 1. Accordingly, the intensity of the second harmonic is small.

In order to rotate the polarization direction of the laser beam 4 90 degrees without changing the beam pattern, a complicated fundamental wave incident optical system is needed, in which a $\lambda/2$ plate 7 is disposed between a collimator lens 5 and a condenser lens 6.

To solve the above-described problem, an optical element, in which an optical wavelength conversion element and a semiconductor laser are integrated, has been proposed (see Japanese National Publication No. 10-506724). In this art, the semiconductor laser, to which a wavelength tuning mechanism is applied, is directly mounted to the optical wavelength conversion element (waveguide SHG). Since the optical wavelength conversion element is excited by the semiconductor laser to which the wavelength tuning mechanism is applied, a center wavelength of stimulated emission of the semiconductor laser is made to coincide with a phase matching wavelength of the optical wavelength conversion element.

However, the semiconductor laser emits semiconductor laser light in a TE mode in which the polarization direction of the semiconductor laser light is parallel to a substrate. In contrast, in the optical wavelength conversion element, semiconductor laser light is emitted in a TM mode in which the polarization direction of the semiconductor laser light is perpendicular to the substrate. Thus, as mentioned above, in order to mount the semiconductor laser, to which the wavelength tuning mechanism is applied, directly to the optical wavelength conversion element, the polarization directions must be made to coincide with each other, and the substrate of the semiconductor laser and the substrate of the optical wavelength conversion element must be mounted so as to be perpendicular to each other. In the conventional optical element, alignment must be carried out with high accuracy in order to make the polarization directions coincide with each other.

SUMMARY OF THE INVENTION

In view of the aforementioned, an object of the present invention is to provide a semiconductor laser module by which high wavelength conversion efficiency can be obtained easily, and a method for forming the semiconductor laser module.

In order to accomplish the object, there is provided a semiconductor laser module comprising: an optical wavelength conversion element which is formed such that, on a ferroelectric crystal substrate having a non-linear optical effect, a TE mode optical waveguide which extends along a substrate surface and in which a polarization direction is parallel to the substrate is formed, and a domain inversion portion, where a spontaneous polarization direction of the substrate is inverted, is periodically formed in the optical waveguide, and the optical wavelength conversion element converts a wavelength of a fundamental wave which propagates in the optical waveguide in a direction along which the domain inversion portions are aligned; and a semiconductor laser which can emit a laser beam in the TE mode in which a polarization direction is parallel to the substrate and which can adjust a center wavelength of stimulated emission of the laser beam, and light emitted from the semiconductor laser is made to enter the optical waveguide, wherein the optical wavelength conversion element and the semiconductor laser are mounted such that the polarization directions of the TE mode coincide with each other and a light exit portion of the semiconductor laser and a light entrance portion of the optical wavelength conversion element coincide with each other.

As described above, because both the optical wavelength conversion element and the semiconductor laser can propagate light in the TE mode in which the polarization direction of laser light is parallel to the substrate, the substrates of the optical wavelength conversion element and the semiconductor laser can be disposed parallel to one another. Accordingly, it is possible to form the semiconductor laser module easily without disposing the optical wavelength conversion element and the semiconductor laser perpendicular to one another and joining them. Since the position of the exit portion of the semiconductor laser and the position of the entrance portion of the optical wavelength conversion element are made to coincide with each other, it becomes easy for the semiconductor laser and the optical wavelength conversion element to receive and output lights, i.e., laser beams, that is to say, it is easy for the optical wavelength conversion element to receive the light, i.e., laser beam, emitted from the semiconductor laser.

In the semiconductor laser module of the present invention, the semiconductor laser can emit laser beams in the TE mode and the center wavelength of stimulated emission of the laser beam can be adjusted. Examples of structures in which the center wavelength of stimulated emission can be adjusted include Distributed Bragg Reflector and Distributed Feedback. With these structures, for example, the center wavelength of stimulated emission of the semiconductor laser can be easily adjusted to the phase matching wavelength of the optical wavelength conversion element. Accordingly, it is possible to adjust the center wavelength of stimulated emission of the semiconductor laser to a wavelength at which the efficiency of the optical wavelength conversion is maximized, and to make the output quantity of light a maximum.

In the optical wavelength conversion element of the semiconductor laser module of the present invention, the spontaneous polarization direction of the substrate forms a predetermined angle θ with respect to the substrate surface within a plane perpendicular to the propagation direction of the fundamental wave. The angle θ is preferably set so as to be greater than 0.2°. In a case of forming the optical waveguide by proton exchange and annealing, the angle θ is preferably set so as to be greater than 0.5°.

In this way, the spontaneous polarization direction of the substrate, i.e., the Z axis direction, forms a predetermined angle θ with respect to the substrate surface, and thus, the spontaneous polarization direction of the substrate, i.e., the Z axis direction, is not perpendicular to the substrate surface. Thus, even if the laser beam which exits from the semiconductor laser enters into the optical waveguide with its linear polarization direction being parallel to the substrate surface, the non-linear optical constant d33 is used and the wavelength can be converted.

It is known that if an angle φ formed by the Z axis and the substrate surface is 0°<φ<20°, a light beam propagates in the TE single mode in an optical waveguide which is formed by proton exchange and subsequent annealing. Accordingly, when the optical waveguide is formed by the proton exchange and annealing, the angle θ is set to θ<20°, so that wavelength conversion can be carried out efficiently.

On the other hand, when a domain inversion structure with an optimal duty ratio, by which maximum wavelength conversion efficiency is obtained, is formed, a cycle for forming the domain inversion portion is generally 50 µm, provided that the angle θ (see FIG. 4) is within a few degrees. Generally, a field distribution of the guided mode can be 1.2 µm at its thinnest. Accordingly, if θ=0.2°, the depth of the domain inversion portion is 1.2 µm, and the domain inversion portion is almost the same size as the field distribution of the guided mode in the depthwise direction. If 0.2°<θ, the domain inversion portion sufficiently overlaps the field distribution of the guided mode, and therefore, wavelength conversion can be carried out efficiently.

The semiconductor laser module can be manufactured easily by the following method for forming the semiconductor laser module. Specifically, the method for forming a semiconductor laser module comprises the steps of: forming an optical wavelength conversion element which is formed such that, on a ferroelectric crystal substrate having a non-linear optical effect, a TE mode optical waveguide which extends along a substrate surface and in which a polarization direction is parallel to the substrate is formed, and a domain inversion portion, where a spontaneous polarization direction of the substrate is inverted, is periodically formed in the optical waveguide, and the optical wavelength conversion element converts a wavelength of a fundamental wave which propagates in the optical waveguide in a direction along which the domain inversion portions are aligned, wherein in a plane perpendicular to a propagation direction of the fundamental wave, the spontaneous polarization direction of the substrate forms a predetermined angle with respect to the substrate surface; forming a semiconductor laser which can emit a laser beam in the TE mode in which a polarization direction is parallel to the substrate, and which can adjust a center wavelength of stimulated emission of the laser beam, and light emitted from the semiconductor laser is made to enter the optical waveguide; and mounting the formed optical wavelength conversion element and the formed semiconductor laser such that the polarization directions of the TE mode coincide with each other and a light exit portion of the semiconductor laser and a light entrance portion of the optical wavelength conversion element are made to coincide with each other.

The method for forming a semiconductor laser module further comprises the steps of: forming a substrate for fixing on which the optical wavelength conversion element and the semiconductor laser are mounted, the substrate for fixing having a flat surface and a stepped surface with a predetermined step which is parallel to the plane; and mounting the optical wavelength conversion element to the flat surface of the substrate for fixing, and mounting the semiconductor laser to the stepped surface of the substrate for fixing.

As a result, alignment in a direction intersecting the flat surface, i.e., in the vertical direction, is not necessary, and the optical adjustment axis is only along the horizontal direction. Therefore, adjustment is easy and misalignment after fixing can be suppressed. It is preferable that the upper surface of the semiconductor laser is joined to the substrate for fixing, and the optical wavelength conversion element is adhered to the stepped surface of the substrate for fixing. In this case, the waveguide faces downward, i.e., positioned further toward the lower side of the stepped surface and it is difficult to effect adjustment while observing from above by using a magnifier such as microscope or the like. However, the substrate of the optical wavelength conversion element is generally transparent, so it is possible to observe easily even from above.

The method for forming a semiconductor laser module further comprises the steps of: forming an optical wavelength conversion element holder which has a reference surface for light entry and is able to fix the optical wavelength conversion element such that a plane of light entry of the optical wavelength conversion element includes the reference surface for light entry; forming a semiconductor laser holder which has a reference surface for light exiting and is able to fix the semiconductor laser such that a light exiting surface of the semiconductor laser includes the reference surface for light exiting; fixing the optical wavelength conversion element to the optical wavelength conversion element holder, and fixing the semiconductor laser to the semiconductor laser holder; and mounting the optical wavelength conversion element and the semiconductor laser such that the reference surface for light entry of the optical wavelength conversion element holder and the reference surface for light exiting of the semiconductor laser holder are joined.

In the holders, end surfaces of respective elements can be arranged, for example, in a straight line. The optical wavelength conversion element and the semiconductor laser can be mounted easily by setting the holders to oppose one another such that the sides thereof with the aligned end surfaces face each other. The position of the exit of the laser beam of the semiconductor laser and the position of the entrance to the waveguide of the optical wavelength conversion element can be adjusted in a planar manner. Accordingly, the semiconductor laser and the optical wavelength conversion element can be easily fixed together while the bonding efficiency is being observed.

BRIEF DESCRIPTION OF THE DRAWINGS

FIGS. 5A and 5B are explanatory views for explaining the fixing of the semiconductor laser and the optical wavelength conversion element.

FIGS. 6A and 6B are explanatory views for explaining the fixing of the semiconductor laser and the optical wavelength conversion element with a thin film being disposed therebetween.

FIGS. 7A through 7C are explanatory views, in accordance with a second embodiment of the present invention, for explaining the fixing of the semiconductor laser and the optical wavelength conversion element by using a substrate thin film having a step.

FIG. 8A is an explanatory view, in accordance with a third embodiment of the present invention, for explaining the fixing of the semiconductor laser to a holder, and FIG. 8B is an explanatory view, in accordance with the third embodiment of the present invention, for explaining the fixing of the optical wavelength conversion element to the holder.

FIGS. 10A and 10B are explanatory views for explaining the fixing of the semiconductor laser and the optical wavelength conversion element in a state where the semiconductor laser and the optical conversion element are fixed to holders, wherein FIG. 10A shows a state in which the semiconductor laser and the optical wavelength conversion element are separated and FIG. 10B shows a state in which the semiconductor laser and the optical wavelength conversion element are joined.

FIG. 11 is a diagram showing a schematic structure of an SHG module.

FIG. 12 is a diagram showing schematic structures of a conventional semiconductor laser and optical wavelength conversion element.

DESCRIPTION OF THE PREFERRED EMBODIMENTS

Embodiments of the present invention will be described hereinafter in detail with reference to the drawings.

[First Embodiment]

Figure 1:
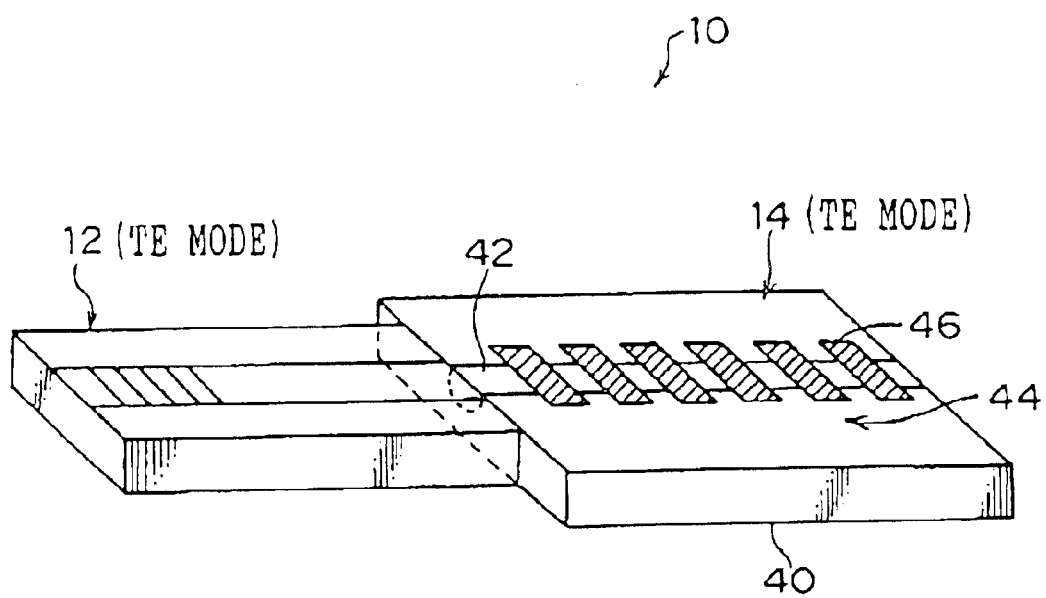
FIG. 1 is a diagram showing a perspective view of a semiconductor laser module according to a first embodiment of the present invention.

FIG. 1 is a perspective view of a semiconductor laser module according to a first embodiment.

As shown in FIG. 1, a semiconductor laser module 10 of the first embodiment is formed by directly bonding a semiconductor laser 12 having a wavelength tuning mechanism and an optical wavelength conversion element 14 which emits a laser beam of a second harmonic with the wavelength of the entered laser beam being the fundamental wave.

The center wavelength of stimulated emission of the semiconductor laser 12 can be tuned and is locked so that the center wavelength of stimulated emission of the semiconductor laser 12 coincides with a phase matching wavelength of the optical wavelength conversion element 14 (details thereof will be described later). The semiconductor laser 12 and the optical wavelength conversion element 14 are directly bonded together at an end surface portion of an optical waveguide 42 of the optical wavelength conversion element 14.

The optical wavelength conversion element 14 includes, on a crystal substrate 40 of, for example, a 5 mol %-MgO-doped LiNbO$_3$ (which will be referred to as MgO-LN hereinafter), the optical waveguide 42 formed by, for example, proton exchange, and a wavelength conversion portion 44 (details thereof will be described later). The wavelength conversion portion 44 forms an SHG element (a second harmonic generator) and has a periodic domain inversion structure which is formed such that a domain inversion portion, in which the spontaneous polarization (domain) of the MgO-LN substrate 40 is inverted, repeats at a predetermined period. A laser beam having a wavelength of, for example, 950 nm emitted from the semiconductor laser 12 is entered into the optical waveguide 42.

In this way, the TE mode-guide-type optical wavelength conversion element 14 and the semiconductor laser 12 having the wavelength tuning mechanism are directly bonded, and therefore, lights emitted from the semiconductor laser 12 and the optical wavelength conversion element 14 are of the same TE mode and the substrates thereof are coplanar. Accordingly, the optical adjustment and fixing become easier. Further, the wavelength of the LD is locked and the LD has a wavelength tunable structure (for example, distributed Bragg reflector or distributed feedback, which will be described later). Thus, the center wavelength of stimulated emission can be adjusted to the phase matching wavelength of the optical wavelength conversion element 14. The semiconductor laser can be adjusted so that the SHG efficiency is maximized and the output quantity of light is a maximum.

Next, a description will be given of a method for forming a semiconductor laser module with the aforementioned structure.

Firstly, a method for forming the semiconductor laser 12 will be explained. In the first embodiment, in order to tune the center wavelength of stimulated emission, a distributed Bragg reflector is used as the semiconductor laser 12. Alternatively, the distributed feedback reflector may also be used.

Figure 2:
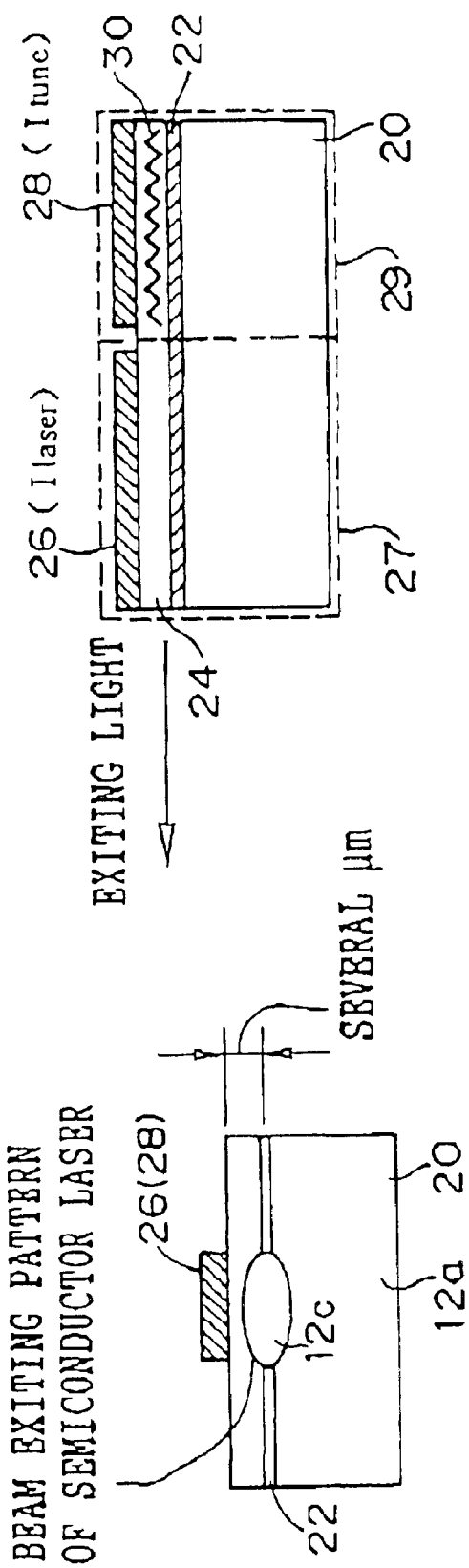
FIGS. 2A and 2B are diagrams showing a side view and a front view of the semiconductor laser according to the first embodiment of the present invention.

As shown in FIGS. 2A and 2B, for example, the semiconductor laser 12 is formed by superposing, on a GaAs substrate 20, a cladding layer (not shown), an active layer 22 in which laser emission is carried out, a cap layer 24, and electrodes 26 and 28 in that order by using an MOCVD crystal apparatus. The semiconductor laser 12 of the first embodiment has a wavelength tuning mechanism, and is structured such that the electrode 26 side functions as a current injection portion 27 for laser emission and the electrode 28 side functions as a wavelength tuning portion 29 for adjusting the center wavelength of stimulated emission. In the wavelength tuning portion 29, a grating 30 for locking and tuning the center wavelength of stimulated emission is formed in a vicinity of the active layer 22. Electric current $I_{laser}$ for laser oscillation is injected into the electrode 26 for laser emission. As a result, the semiconductor laser 12 emits. Electric current $I_{tune}$, which is the electric current for laser oscillation, is injected into the electrode 28 for wavelength tuning. In this way, by changing only the refractive index of the element, the Bragg wavelength at the grating 30 can be changed. In addition to the above-described semiconductor laser, a three-electrode type semiconductor laser, which further includes electrodes for phase control which can tune the wavelength more continuously, may be used as the semiconductor laser 12.

By forming the semiconductor laser 12 with the aforementioned structure, the exit position of the laser beam which exits from the semiconductor laser 12 is a few μm lower than the position of the electrode 26.

Next, a method for forming the optical wavelength conversion element 14 will be described.

The optical wavelength conversion element 14 of the first embodiment is formed such that, on a ferroelectric crystal substrate having a non-linear optical effect, an optical waveguide, which extends along the surface of the ferroelectric crystal substrate, is formed. On the optical waveguide, a domain inversion portion, in which a spontaneous polarization direction of the substrate is inverted, is periodically formed. Further, the optical wavelength conversion element is designed to convert the wavelength of the fundamental wave which propagates in the optical waveguide in the direction along which the domain inversion portions are aligned. In a plane which is perpendicular to the propagation direction of the fundamental wave, the spontaneous polarization direction of the substrate forms an angle θ (0°<θ<20°) with the surface of the substrate.

Examples of the ferroelectric crystal substrate appropriately used with the present invention include, but are not limited to, a non-doped $LiNb_xTa_{1-x}O_3$ (0≦x≦1) substrate and an MgO-doped $LNbO_3$ substrate. A Zn-doped $LiNb_xTa_{1-x}O_3$ substrate, an Sc- or MgO-doped $LiNb_xTa_{1-x}O_3$ substrate, and substrates of $KTiOPO_4$, $KNbO_3$ or the like can also be used. Since the MgO-doped $LiNbO_3$ substrate is highly resistant to optical damage, it is preferable to a non-doped $LiNb_xTa_{1-x}O_3$ substrate or the like.

Figure 3:
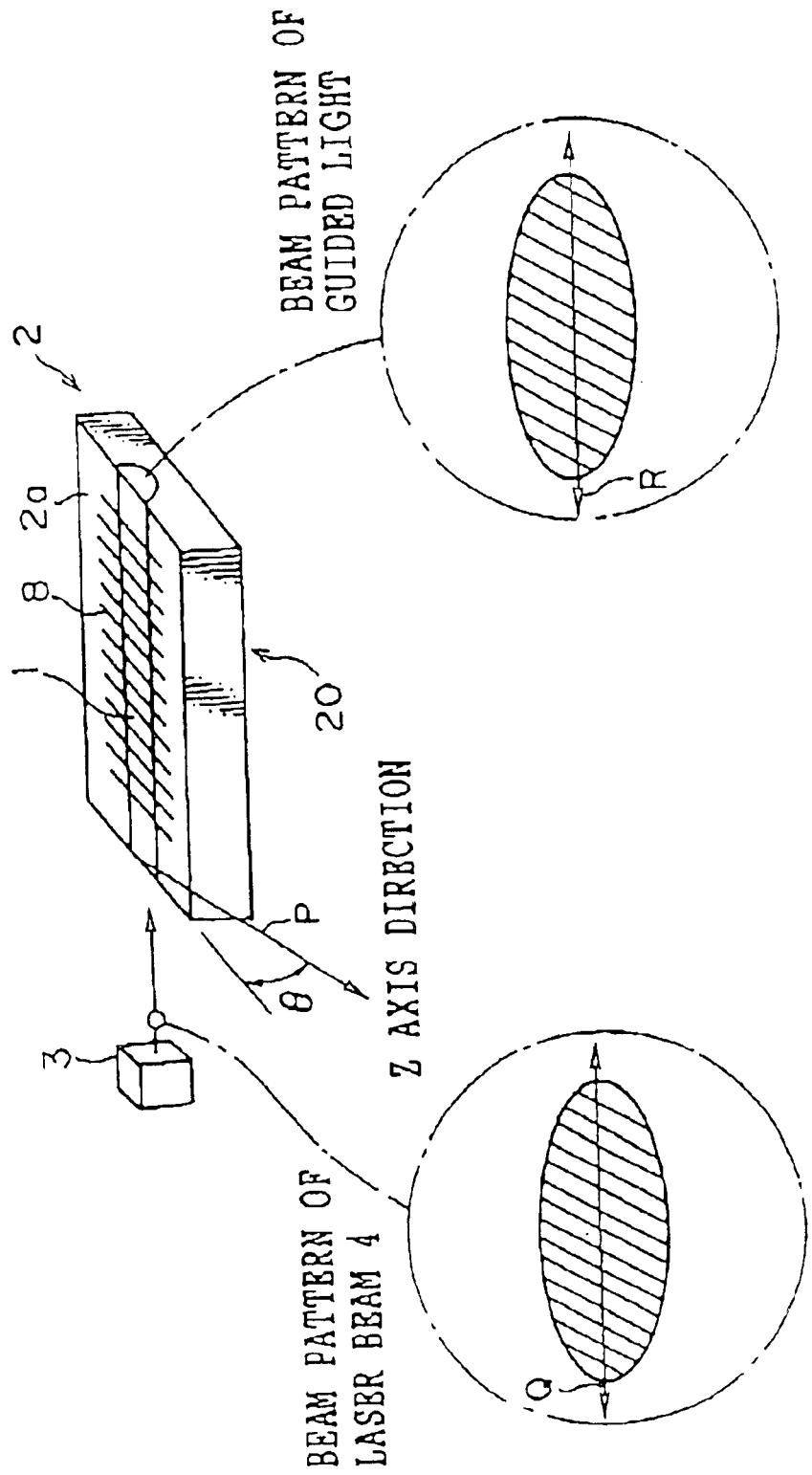
FIG. 3 is a diagram for schematically explaining a perspective view of an optical wavelength conversion element according to the first embodiment of the present invention.

In the optical wavelength conversion element 14 with the aforementioned structure, as shown in FIG. 3, the spontaneous polarization direction of a substrate 2, i.e., the Z axis direction, is not perpendicular to a substrate surface 2a. Accordingly, even if a laser beam 4 exiting from a semiconductor laser 3 is entered into an optical waveguide 1 (the optical waveguide 42 in FIG. 1) with the linear polarization direction of the laser beam (the direction of arrow Q) being parallel to the substrate surface 2a, a non-linear optical constant $d_{33}$ can be used and the wavelength conversion is possible. In this case, an electrical field vector of the laser beam 4 is parallel to the substrate surface 2a, and the laser beam 4 propagates in the optical waveguide 1 in the TE mode. An effective non-linear optical constant at this time is $d_{33}$ cos θ. In FIG. 3, the same elements as those explained with respect to the prior art shown in FIG. 12 are denoted by the same reference numerals.

As described above, if the laser beam 4 enters into the optical waveguide 1 such that the linear polarization direction of the laser beam 4 is parallel to the substrate surface 2a, a λ/2 plate or the like used to rotate the linear polarization direction is unnecessary and the fundamental wave incident optical system becomes simpler. Further, the semiconductor laser 12 can be directly bonded to an end surface of the optical waveguide 1. When the laser beam 4 thus enters the optical waveguide 1, the efficiency with which the laser beam 4 is input into the optical waveguide 1 becomes higher.

Figure 4:
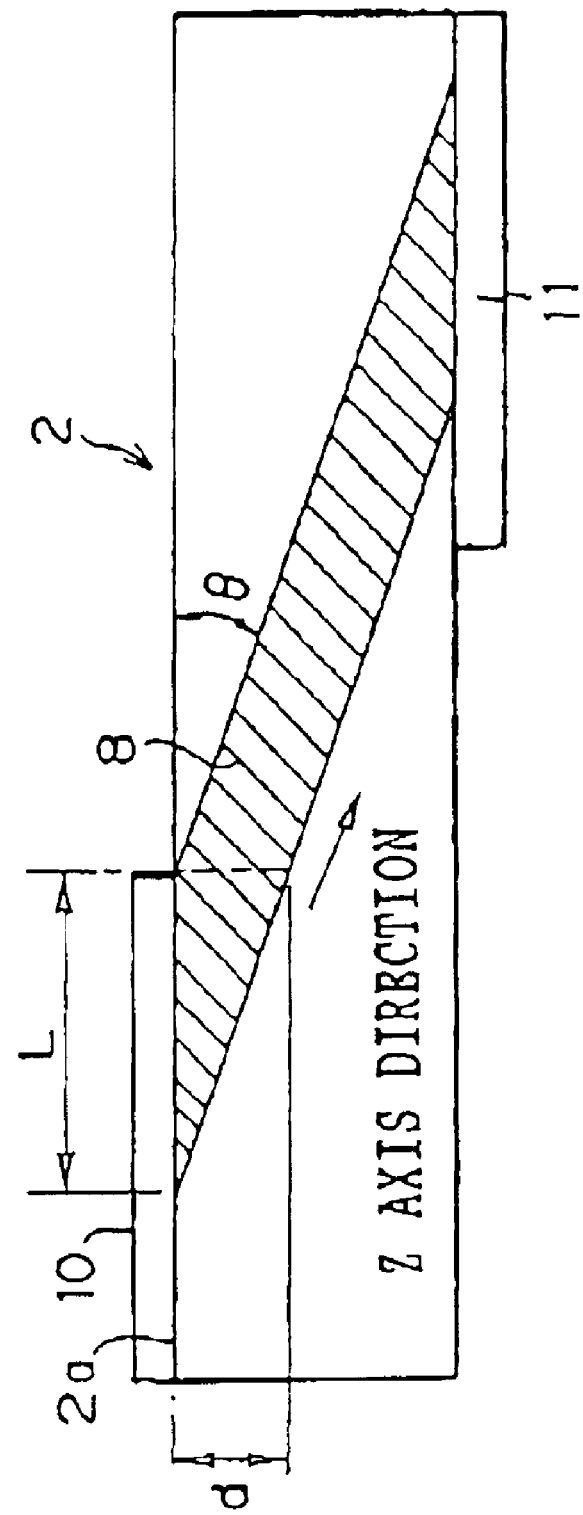
FIG. 4 is an explanatory view for explaining the polarization direction of a substrate of the optical wavelength conversion element in accordance with the first embodiment of the present invention.

When the spontaneous polarization direction of the substrate 2, i.e., the Z axis direction, forms an angle θ with the substrate surface 2a, as shown in FIG. 4, a depth d of a domain inversion portion 8 is basically calculated by the formula d=L tan θ. However, if a case where 1 μm of spreading of the domain inversion area is considered, d becomes as follows:

$$d = L \tan \theta + 1 \, \mu m \quad (1)$$

wherein L is not determined directly by the magnitude of a means for applying an electric field in order to invert the domain. (In FIG. 4, as an example of such a means, a comb-shaped electrode 10 and a plate electrode 11 are shown.) Rather, L tends to increase as the value of θ becomes larger. When the domain inversion portion 8 is formed such that θ=0°, L becomes a minimum. In the example of FIG. 12, since the domain inversion portion 8 is formed such that θ=90°, L becomes a maximum (i.e., domain inversion occurs at the entire region opposing electrodes for applying the electric field).

Here, by setting the angle θ to be large to a certain extent, the depth d of the domain inversion portion 8 can be made sufficiently deep. In this way, if the domain inversion portion 8 can be made sufficiently deep, the overlap integral of the domain inversion portion 8 and the guided light becomes large so that a higher wavelength conversion efficiency can be obtained.

In the first embodiment, the optical wavelength conversion element 14 with the above-described structure is used and the semiconductor laser is disposed so that laser beams actually propagate in the TE mode. Accordingly, as described above, the efficiency with which laser beams are input into the optical waveguide becomes high, the fundamental wave incident optical system becomes simpler, and a high wavelength conversion efficiency can be obtained.

It is thought that when an angle φ formed by the Z axis and the substrate surface is 0°<φ<70°, light beams propagate in the proton-exchanged optical waveguide in the TE single mode (for example, see Journal of Optical Communications, 5 (1984) 1. pp. 16 to 19). This angle φ corresponds to the angle θ in the present invention. Accordingly, when the optical waveguide is formed by proton exchange, if the angle θ is set to a range of θ<70°, wavelength conversion is carried out efficiently.

It is known that when the angle φ formed by the Z axis and the substrate surface is 0°<φ<20°, light beams propagate in the TE single mode in the optical waveguide which is formed by proton exchange and subsequent annealing. Accordingly, when the optical waveguide is formed by proton exchange and annealing, if the angle θ is set to a range of θ<20°, wavelength conversion is carried out efficiently.

On the other hand, it is known that in the case of forming a domain inversion structure which has an optimal duty ratio by which a maximum wavelength conversion efficiency can be obtained (i.e., the width ratio of the domain inversion portion to the domain non-inversion portion is 1:1), the dimention L shown in FIG. 4 is around 50 μm provided that θ is within a few degrees. In general, a field distribution of the guided mode can be about 1.2 μm at its thinnest. Therefore, by using above formula (1), if θ=0.2°, the depth d of the domain inversion portion is 1.2 μm and the domain inversion portion is, in the depthwise direction thereof, the same size as the field distribution of the guided mode. If 0.2°<θ, the domain inversion portion sufficiently overlaps the field distribution of the guided mode and wavelength conversion can be carried out efficiently.

As mentioned above, the field distribution of the guided mode can be made to be a minimum of about 1.2 μm. However, the larger the field distribution, the more stably external light can be entered into the optical waveguide. In actuality, if the field distribution of the guided mode is larger than 1.4 μm, external light enters stably into the optical waveguide. With above formula (1), if θ=0.5°, the depth d of the domain inversion portion is d=1.4 μm. Accordingly, if 0.5°<θ, a fundamental wave enters the optical waveguide stably, and the domain inversion portion overlaps with the field distribution of the guided mode so that the wavelength conversion is carried out efficiently.

Accordingly, the optical wavelength conversion element 14 of the first embodiment is formed on an LiNbO$_3$ substrate surface by proton exchange and annealing. Therefore, a waveguide is formed in the vicinity of the substrate surface, and laser beams which propagate in the waveguide also propagate in the vicinity of the substrate surface.

FIG. 5A is a plan view and FIG. 5B is a side view of the semiconductor laser 12 and the optical wavelength conversion element 14 formed in the aforementioned manner. As shown in these figures, the semiconductor laser 12 and the optical wavelength conversion element 14 are joined together such that the exit portion of the semiconductor laser 12 coincides with the waveguide portion (i.e., the entrance portion) of the optical wavelength conversion element 14. Lights emitted from the optical wavelength conversion element 14 and the semiconductor laser 12 having the wavelength tuning mechanism are of the TE mode, and the substrates of the optical wavelength conversion element 14 and the semiconductor laser 12 are coplanar. Accordingly, optical adjustment and fixing thereof are easy. Further, because the wavelength of the LD is locked and the LD has a waveguide tunable structure, the center wavelength of stimulated emission of the semiconductor laser 12 can be adjusted to the phase matching wavelength of the optical wavelength conversion element 14. As a result, the semiconductor laser can be adjusted such that an SHG efficiency is maximized, and the output quantity of light is a maximum.

As illustrated in FIGS. 6A and 6B, the semiconductor laser 12 and the optical wavelength conversion element 14 may be bonded with an SiO$_2$ thin film 11 being interposed therebetween.

Specifically, on an end surface 12a of the semiconductor laser 12, the SiO$_2$ thin film 11 serving as an insulator is deposited by the electron beam evaporation method. At this time, the evaporation is carried out with, for example, a portion including a light emitting point 12c being masked by a metallic mask or a resist mask. As a result, the SiO$_2$ thin film 11 is adhered to portions other than the portion including the light emitting point 12c. Here, the thickness of the SiO$_2$ thin film 11 is 0.5 μm to 3 μm. When the thickness of the SiO$_2$ film exceeds 8 μm, the bonding efficiency between the optical waveguide 42 and the semiconductor 12 is half of or less than half of the bonding efficiency in a case in which the thin film 11 is not formed. Therefore, a thickness in the above-mentioned range is desirable.

The SiO$_2$ thin film 11 is adhered and then the semiconductor laser 12 is bonded to the optical wavelength conversion element 14 at the end surface 12a side of the semiconductor laser 12. As a result, the semiconductor laser module shown in FIGS. 1 and 6 can be obtained. In this module, a laser beam, which is emitted from the semiconductor laser 12 and has a central wavelength of 950 nm, enters the optical waveguide 42 of the optical wavelength conversion element 14. This laser beam propagates in the optical waveguide 42 in the TE mode, phase matching (so-called pseudo phase matching) is carried out at the periodic domain inversion regions, and therefore, the laser beam is converted to a second harmonic having a wavelength of 475 nm, which is half of the central wavelength. The second harmonic also propagates in a channel optical waveguide 42 in the guided mode and exits from the end surface of the optical waveguide.

In the semiconductor laser module, because the optical wavelength conversion element 14 and the semiconductor laser 12 are bonded together via the SiO$_2$ thin film 11 disposed therebetween, the end surface of the optical waveguide at the end surface 12a of the semiconductor laser 12 and the end surface of the optical waveguide of the optical wavelength conversion element 14 do not rub against each other, and therefore, damage of both end surfaces can be effectively prevented. This semiconductor laser module can be manufactured at a high yield, and has high reliability and is high performance.

Because the SiO$_2$ thin film 11 is adhered to portions other than the portion including the light emitting point 12c of the semiconductor laser 12, the thin film 11 is disposed on only portions other than the region through which the laser beam 20 passes. Accordingly, it is possible to suppress propagation loss of the laser beam caused by the thin film 11.

Because the SiO$_2$ thin film 11, which is the insulator, is especially used in the semiconductor laser module, it is possible to prevent electrical current from leaking from the semiconductor laser 12 through the thin film 11 and to ensure normal operation of the semiconductor laser 12.

As explained above, according to the first embodiment, light coupling with a high coupling efficiency is possible without damaging the end surfaces of the LD and the waveguide. Moreover, because adjustment is easy, it is possible to assemble the semiconductor laser module stably.

Since a DBR-LD provided with a wavelength tuning mechanism is used, the center wavelength of stimulated emission of the semiconductor laser can be adjusted easily to the phase matching wavelength of the optical wavelength conversion element, and a light source with high SHG efficiency can be realized.

[Second Embodiment]

In a second embodiment, the semiconductor laser 12 and the optical wavelength conversion element 14 are disposed upside-down, on, for example, an Si substrate. Because the second embodiment has substantially the same structure as that of the first embodiment, the same portions as those of the first embodiment are denoted by the same reference numerals and description thereof is omitted.

As illustrated in FIG. 7A, the waveguide 42 of the optical wavelength conversion element 14 is positioned in the vicinity of a surface of the wavelength conversion element 14. The waveguide of the semiconductor laser 12 is also positioned in the vicinity of surface of the semiconductor laser 12. In order to facilitate assembly, a structure is considiered in which the semiconductor laser 12 and the optical wavelength conversion element 14 are disposed upside-down and made to contact an Si substrate surface (see FIG. 7B). In this case, the position of the waveguide 42 of the optical wavelength conversion element 14 becomes closer to the surface of the Si substrate 50, and a beam exiting position 12c of the semiconductor laser 12 becomes a few $\mu$m higher than the position of the waveguide 42 of the optical conversion element 14. Accordingly, the beam exiting position 12c of the semiconductor laser 12 and the position of the waveguide 42 of the optical wavelength conversion element 14 do not coincide with each other.

Here, as shown in FIG. 7B, a step 52 is formed in advance at one side of the plate-shaped Si substrate 50 by lithography. The step 52 can accommodate at least the semiconductor laser 12 and corresponds to the difference between the distance from an upper surface of the semiconductor laser 12 to the beam exiting position 12c and the distance from an upper surface of the optical wavelength conversion element 14 to the waveguide 42. Further, the semiconductor laser 12 and the optical wavelength conversion element 14 are disposed such that the upper surface sides thereof contact the substrate 50 (see FIG. 7C). Accordingly, the beam exiting position 12c of the semiconductor laser 12 and the position of the waveguide 42 of the optical wavelength conversion element 14 coincide with each other accurately in the vertical direction (the up-down direction in FIG. 7).

Next, the beam exiting position 12c of the semiconductor laser 12 and the position of the waveguide 42 of the optical wavelength conversion element 14 are made to coincide with each other in the horizontal direction (the left-right direction in FIGS. 7A through 7C), while observing by use of a magnifier such as a microscope or the like. In this case, the beam exiting position 12c of the semiconductor laser 12 and the position of the waveguide 42 of the optical wavelength conversion element 14 are adjusted such that the quantity of light of the light beam exiting from the waveguide 42 of the optical wavelength conversion element 14 is maximum. After adjustment, the semiconductor laser 12 and the optical wavelength conversion element 14 are fixed by an adhesive or solder bonding or metallic bonding. In the case of solder bonding or metallic bonding, metallic patterns for bonding are formed in advance on the Si substrate 50, the optical wavelength conversion element 14, and the semiconductor laser 12, respectively, such that these metallic patterns for bonding between the Si substrate 50 and the optical wavelength conversion element 14 and between the Si substrate 50 and the semiconductor laser 12 overlap. Thereafter, the overall temperature is raised, and the metals melt so that bonding is carried out. The solder bonding may be bump solder bonding in which the thickness can be controlled with high accuracy.

In this way, in the second embodiment, because the machining process of the Si substrate 50, the optical wavelength conversion element 14 and the semiconductor laser 12 can be carried out accurately, alignment in the vertical direction is not necessary and the optical adjustment axis extends only in the horizontal direction. Therefore, adjustment is easy and misalignment after fixing can be suppressed. For example, the light beam diameter of the optical wavelength conversion element 14 in the vertical direction is only 2 to 3 $\mu$m and the light beam diameter of the semiconductor laser 12 in the vertical direction is only about lam. Accordingly, adjustment and fixing in the vertical direction, which have been conventionally difficult, can be carried out easily.

In the present second embodiment, in order to join the upper surfaces of the semiconductor laser 12 and the optical wavelength conversion element 14 to the surface of the Si substrate 50, the optical wavelength conversion element 14 is turned upside-down so that the waveguide 42 side thereof faces downwards. It is difficult to carry out adjustment while observing the waveguide from above by using a microscope. However, since the substrate of the optical wavelength conversion element 14 is transparent, it is possible to observe the waveguide even from the optical wavelength conversion element 14 substrate side of the optical wavelength conversion element 14. On the other hand, as the semiconductor laser 12 is not transparent with respect to visible light, the position of the waveguide cannot be determined. In the second embodiment, however, because the waveguides of the semiconductor laser 12 and the optical wavelength conversion element 14 are aligned only by the adjustment in the horizontal direction, the adjustment can be carried out easily. Moreover, as another means, if adjustment is carried out using a halogen lamp as a light source and a CCD which is sensitive to infrared light as a sensor, because infrared light passes through a GaAs substrate used for the semiconductor laser, it is possible to observe the position of the waveguide of the semiconductor laser even from the semiconductor laser substrate side of the semiconductor laser. Therefore, the aforementioned problem can be solved.

[Third Embodiment]

In a third embodiment, the semiconductor laser 12 and the optical wavelength conversion element 14 are disposed on, for example, an Si substrate without being turned upside-down. Because the third embodiment has substantially the same structure as that of the second embodiment, the same portions as those of the second embodiment are denoted by the same reference numerals and description thereof is omitted.

As explained above, when the semiconductor laser 12 and the optical wavelength conversion element 14 are disposed on the Si substrate without being turned upside-down, it is difficult to accurately align the respective beam positions of the semiconductor laser 12 and the optical wavelength conversion element 14 in the vertical direction. The thicknesses of the semiconductor laser 12 and the optical wavelength conversion element 14 are all about 500 μm. Also, the thickness from the back surface of the optical wavelength conversion element 14 and the semiconductor laser 12 to the beam exiting position is 500 μm. Therefore, the thickness from the back surface of the substrate to the beam exiting position must be adjusted accurately in advance by polishing or the like. The beam diameter of the laser beam is 1 μm or 2 to 3 μm, and therefore, a fixing accuracy of 0.1 μm is necessary. If the thickness cannot be adjusted to an accuracy of 0.1 μm, the beam positions of the optical wavelength conversion element and the semiconductor laser will not coincide with each other. However, it is technically difficult to work such that the thickness of the optical wavelength conversion element 14 and the semiconductor laser 12 are 0.1 μm, and it is impossible to manufacture the substrate at a high yield inexpensively.

In the present third embodiment, the semiconductor laser 12 and the optical wavelength conversion element 14 are respectively mounted to holders, and the holders are joined together so as to obtain a semiconductor laser module.

Figure 9A:
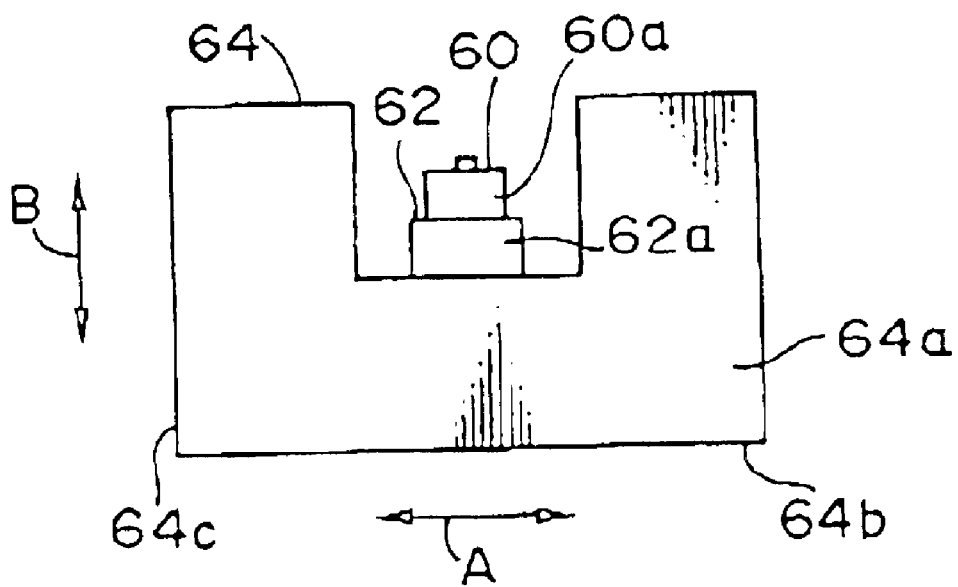
FIG. 9A is a front view showing a state in which the semiconductor laser is fixed to the holder.

If the semiconductor laser 12 and the optical wavelength conversion element 14 face upwards, their waveguides can be observed well by using a microscope. Accordingly, adjustments of the waveguides of the semiconductor laser 12 and the optical wavelength conversion element 14 become easy. As illustrated in FIGS. 8A and 9A, an LD chip 60, which is a semiconductor laser main body, is mounted on a heat sink 62. The heat sink 62, to which the LD chip 60 is mounted, is mounted to an LD holder 64. The LD holder 64 is formed by a block whose cross-section is formed in a substantial U-shape, and the LD chip 60 disposed on the heat sink 62 is mounted to a concave portion of the block.

An end surface 64a of the LD holder 64 is polished with high accuracy and is formed so as to be able to come in close contact with one reference surface 54a of a reference plate 54. When the heat sink 62, on which the LD chip 60 is disposed, is mounted to the LD holder 64, end surfaces of the LD chip 60, the heat sink 62 and the LD holder 64 are aligned along a straight line with respect to the reference surface 54a of the reference plate 54. For example, an end surface 60a of the LD chip 60, an end surface 62a of the heat sink 62, and the end surface 64a of the LD holder 64 are abutted against the reference surface 54a of the reference plate 54, and are mounted to the reference surface 54a.

Figure 9B:
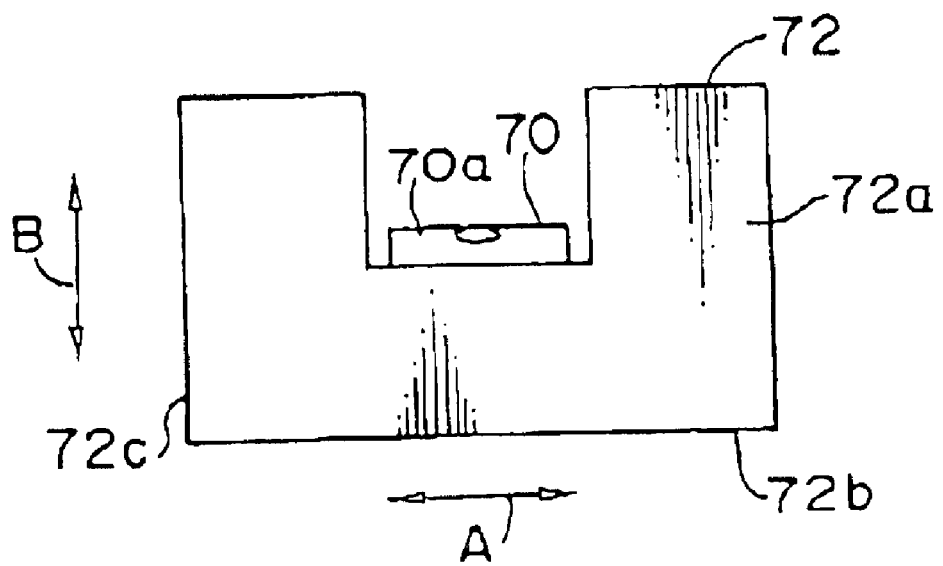
FIG. 9B is a front view showing a state in which the optical wavelength conversion element is fixed to the holder.

Similarly, in the case of the optical wavelength conversion element 14, as shown in FIGS. 83 and 9B, an SHG waveguide 70, which is an optical wavelength conversion element main body, is mounted to an SHG holder 72. The SHG holder 72 is formed by a block whose cross-section is formed in a substantial U-shape. The SHG waveguide 70 is mounted to a concave portion of the block. An end surface 72a of the SHG holder 72 is polished with high accuracy and is formed so as to be able to be set in close contact with another reference surface 54b of the reference plate 54. The SHG waveguide 70 is mounted to the SHG holder 72 such that respective end surfaces of the SHG waveguide 70 and the SHG holder 72 are aligned along a straight line with respect to the reference surface 54b of the reference plate 54. For example, an end surface 70a of the SHG waveguide 70 and an end surface 72a of the SHG holder 72 are abutted against the reference surface 54a of the reference plate 54, and are mounted to the reference plate 54.

These holders are formed as described above (see FIG. 10A). Then, the holders are positioned facing each other such that end surfaces of the holders at the sides aligned in a straight line face each other. Next, the laser beam exiting position of the semiconductor laser 12 and the beam entrance position of the waveguide 42 of the optical wavelength conversion element 14 are adjusted in a planar manner (see FIG. 10B). After the adjustment of the surfaces to be joined, the holders are fixed together by an adhesive. Fixing by using YAG laser welding may be used instead. In the case of YAG laser welding, the holders can be fixed by illuminating a pulse YAG laser onto a plurality of points of the outer peripheral portions of the surfaces to be joined. Since the LD chip 60 and the SHG waveguide 70 are adjusted in advance by using the reference plate 54 so as to be aligned in a straight line, they do not hit against each other and are not broken. Therefore, it was possible to obtain 50% of the bonding efficiency.

The depths of respective concave portions of the LD holder 64 and the SHG holder 72 are preferably formed in advance with a difference therebetween, so that the distance from a bottom surface 64b of the LD holder 64 to the beam exiting position coincides with the distance from a bottom surface 72b of the SHG holder 72 to the beam entrance position of the SHG waveguide 70. Accordingly, by adjusting the LD holder 64 and the SHG holder 72 only in the horizontal direction (the direction of arrow A in FIG. 9), the beam exiting position 12c of the semiconductor laser 12 can easily be made coincident with the position of the waveguide 42 of the optical wavelength conversion element 14.

A side surface 64c of the LD holder 64 and a side surface 72c of the SHG holder 72 are formed with high accuracy. The LD chip 60 is mounted to the LD holder 64 and the SHG waveguide 70 is mounted to the SHG holder 72 such that, in the horizontal direction of the LD holder 64 and the SHG holder 72 (the direction of arrow A in FIG. 9), the distance from the side surface 64c to the chip 60 coincides with the distance from the side surface 72c to the holder 72. Thereby, by adjusting the LD holder 64 and the SHG holder 72 only in the vertical direction (the direction of arrow B in FIG. 9), the beam exiting position 12c of the semiconductor laser 12 can easily be made to coincide with the position of the waveguide 42 of the optical wavelength conversion element 14.

Next, an SHG module is formed by adjusting and fixing a collimating lens 58 to the semiconductor laser 12 and the optical wavelength conversion element 14 which have been formed in the aforementioned manner (i.e., to the semiconductor laser module). Specifically, as illustrated in FIG. 11, an assembly of the semiconductor laser 12 mounted to the LD holder 64 and the optical wavelength conversion element 14 mounted to the SHG holder 72 is fixed to a stand 56. The collimating lens 58 is mounted to the stand 56. The assembly is fixed while being adjusted such that the light exiting from the collimating lens 58 is collimated light. By adjusting the injection currents $I_{laser}$ and $I_{tune}$, the center wavelength of stimulated emission of the semiconductor laser 12 is adjusted to the phase matching wavelength of the optical wavelength conversion element 14. Accordingly, it is possible to obtain a maximum SHG output.

By adjusting the injection currents $I_{laser}$ and $I_{tune}$, the center wavelength of stimulated emission can be adjusted in in units of several nm's. With a semiconductor laser having an output of 50 mW, a laser beam having a power of 25 mW is inputted into the waveguide, and a second harmonic having a wavelength of 490 nm and a power of 2 mW can be generated as its output.

In the present invention, guided light may be modulated by a directional coupler. For example, guided light may be modulated such that light intensity of an intermediatelevel can be obtained by switching between two optical waveguides by applying voltage to electrodes adjacent to two optical waveguides having an electro-optical effect, as disclosed in JP-A No. 10-161165 or applying intermediate voltage to the electrodes.

The waveguide type optical modulator of the present invention may be structured by providing a Ti diffusion optical waveguide or the like, instead of providing the aforementioned proton exchanged optical waveguide.

Further, the substrate on which the optical waveguide is formed is not limited to the aforementioned MgO-doped LiNbO$_3$ substrate. Other LiNbO$_3$ substrates, a non-doped LiNbO$_3$ substrate, ZnO- or Sc-doped LiNbO$_3$ substrates, an LiTaO$_3$ substrate, MgO- or ZnO-doped LiTaO$_3$ substrates and the like may be used.

Instead of the optical wavelength conversion element including the aforementioned waveguide, an optical wavelength conversion element including a QPM waveguide may be used.

What is claimed is:

1. A semiconductor laser module comprising:
an optical wavelength conversion element comprising:
a ferroelectric crystal substrate, and
a transverse electric (TE) mode optical waveguide which extends along the ferroelectric crystal substrate surface, said optical waveguide having a polarization direction parallel to the ferroelectric crystal substrate, and said optical waveguide further having a periodic domain inversion portion, where a spontaneous polarization direction of the ferroelectric crystal substrate is inverted, and the optical wavelength conversion element converts a wavelength of a fundamental wave which propagates in the optical waveguide in a direction along which the domain inversion portions are aligned; and
a semiconductor laser which can emit a laser beam in the TE mode in which a laser polarization direction is parallel to the ferroelectric crystal substrate and which can adjust a center wavelength of stimulated emission of the laser beam, and light emitted from the semiconductor laser is made to enter the optical waveguide,
wherein said optical wavelength conversion element and said semiconductor laser are mounted such that the polarization directions of the TE mode of the waveguide and laser coincide with each other and a light exit portion of the semiconductor laser and a light entrance portion of the optical wavelength conversion element coincide with each other,
wherein the spontaneous polarization direction of said substrate forms a predetermined angle with respect to the substrate surface in a plane perpendicular to a propagation direction of the fundamental wave, and
wherein the light exit portion of said semiconductor laser and the light entrance portion of said optical wavelength conversion element are bonded together with a thin film insulator interposed therebetween.

2. A semiconductor laser module according to claim 1, wherein said predetermined angle is larger than 0° and smaller than 20°.

3. A semiconductor laser module according to claim 1, wherein said predetermined angle is larger than 0.2°.

4. A semiconductor laser module according to claim 1, wherein said optical waveguide is formed by proton exchange and annealing, and said predetermined angle is larger than 0.5°.

5. A semiconductor laser module according to claim 1, wherein said predetermined angle is smaller than 20°.

6. A semiconductor laser module according to claim 1, wherein said semiconductor laser makes the center wavelength of stimulated emission of the laser beam coincide with a phase matching wavelength of the optical wavelength conversion element.

7. A semiconductor laser module according to claim 1, wherein said semiconductor laser includes a substrate, and said substrate of said semiconductor laser and said ferroelectric crystal substrate of said optical wavelength conversion element are directly bonded.

8. A semiconductor laser module according to claim 1, wherein the thin film insulator is an SiO$_2$ thin film.

9. A semiconductor laser module according to claim 1, wherein a thickness of the thin film insulator is 0.5 to 3 μm.

10. A semiconductor laser module according to claim 1, wherein said optical wavelength conversion element converts a wavelength of said fundamental wave to a wavelength of a second harmonic of said fundamental wave.

11. A method for forming a semiconductor laser module, comprising the steps of:
forming an optical wavelength conversion element including a ferroelectric crystal substrate, and
a transverse electric (TE) mode optical waveguide which extends along the ferroelectric crystal substrate surface, said optical waveguide having a waveguide polarization direction parallel to the ferroelectric crystal substrate, and a domain inversion portion, where a spontaneous polarization direction of the ferroelectric crystal substrate is inverted, is periodically formed in the optical waveguide, and the optical wavelength conversion element converts a wavelength of a fundamental wave which propagates in the optical waveguide in a direction along which the domain inversion portions are aligned, wherein in a plane perpendicular to a propagation direction of the fundamental wave, the spontaneous polarization direction of the substrate forms a predetermined angle with respect to the substrate surface;
forming a semiconductor laser which can emit a laser beam in the TE mode in which a laser polarization direction is parallel to the ferroelectric crystal substrate, and which can adjust a center wavelength of stimulated emission of the laser beam, and light emitted from the semiconductor laser is made to enter the optical waveguide;
mounting said formed optical wavelength conversion element and said formed semiconductor laser such that the polarization directions of the TE mode of the waveguide and laser coincide with each other and a light exit portion of the semiconductor laser and a light entrance portion of the optical wavelength conversion element are made to coincide with each other;
forming an optical wavelength conversion element holder which has a reference surface for light entry and is able to fix said optical wavelength conversion element such that a plane of light entry of said optical wavelength conversion element includes said reference surface for light entry;
forming a semiconductor laser holder which has a reference surface for light exiting and is able to fix said semiconductor laser such that a light exiting surface of said semiconductor laser includes said reference surface for light exiting;
fixing said optical wavelength conversion element to said optical wavelength conversion element holder, and fixing said semiconductor laser to said semiconductor laser holder; and mounting said optical wavelength conversion element and said semiconductor laser such that the reference surface for light entry of said optical wavelength conversion element holder and the reference surface for light exiting of said semiconductor laser holder are joined.

12. A method for forming a semiconductor laser module according to claim 11, further comprising the steps of:

forming a substrate for fixing on which said optical wavelength conversion element and said semiconductor laser are mounted, the substrate for fixing having a flat surface and a stepped surface with a predetermined step which is parallel to said plane; and mounting the optical wavelength conversion element to said flat surface of said substrate for fixing, and mounting the semiconductor laser to the stepped surface of said substrate for fixing.

13. A method for forming a semiconductor laser module according to claim 12, wherein said step can accommodate at least the semiconductor laser, and corresponds to a difference between a distance from an upper surface of the semiconductor laser to the light exit position of a laser beam and a distance from an upper surface of the optical wavelength conversion element to the optical waveguide.

14. The method of claim 11, wherein the polarization directions of the laser and waveguide are each parallel to a ferroelectric crystal substrate.

15. The semiconductor laser module of claim 1, wherein the predetermined angle is defined as θ, and wherein $$d = L \tan \theta,$$

where d is a depth of domain inversion and L is a length of a domain inversion region.

16. The semiconductor laser module of claim 1, wherein the predetermined angle is defined as θ, and wherein $$d = L \tan \theta + C,$$

where d is a depth of domain inversion and L is a length of a domain inversion region, and C is a spreading constant for domain inversion.

17. The semiconductor laser module of claim 15, wherein a width ratio of a domain inversion region to a domain non-inversion region is 1:1.

18. The module of claim 1, wherein a top surface of the substrate is disposed with a first electrode and a bottom surface of the substrate is disposed with a second electrode, wherein the first and second electrodes are offset from each other such that the electrodes do not overlap, said electrodes used to form the domain inversion regions.

19. The module of claim 1, wherein the polarization directions of the laser and waveguide are each parallel to a ferroelectric crystal substrate.

20. The semiconductor laser module of claim 1, wherein the semiconductor laser and the optical wavelength conversion element are disposed junction-down (upside-down) on a substrate.

21. A semiconductor laser module comprising:

an optical wavelength conversion element;

a semiconductor laser;

a semiconductor laser holder which is fixed to the semiconductor laser; and an optical wavelength conversion element holder which is fixed to the optical wavelength conversion element, wherein the optical wavelength conversion element comprises:

a ferroelectric crystal substrate, and a transverse electric (TE) mode optical waveguide which extends along the ferroelectric crystal substrate surface, said optical waveguide having a polarization direction parallel to the ferroelectric crystal substrate, and said optical waveguide further having a periodic domain inversion portion, where a spontaneous polarization direction of the ferroelectric crystal substrate is inverted, and the optical wavelength conversion element converts a wavelength of a fundamental wave which propagates in the optical waveguide in a direction along which the domain inversion portions are aligned;

wherein the semiconductor laser can emit a laser beam in the TE mode in which a laser polarization direction is parallel to the ferroelectric crystal substrate and can adjust a center wavelength of stimulated emission of the laser beam, wherein light emitted from the semiconductor laser is made to enter the optical waveguide conversion element, wherein the optical wavelength conversion element and the semiconductor laser are mounted such that the polarization directions of the TE mode of the waveguide and laser coincide with each other and a light exit portion of the semiconductor laser and a light entrance portion of the optical wavelength conversion element coincide with each other, wherein the spontaneous polarization direction of said substrate forms a predetermined angle with respect to the substrate surface in a plane perpendicular to a propagation direction of the fundamental wave, and wherein the semiconductor laser holder and the optical wavelength conversion holder are disposed such that the light exit portion of the semiconductor laser is joined to the light entrance portion of the optical wavelength conversion element.

22. The semiconductor laser module of claim 21, wherein the semiconductor laser holder comprises a heat sink which accepts the semiconductor laser for mounting thereon.

23. The semiconductor laser module of claim 21, wherein the semiconductor laser holder and the optical wavelength conversion element holder are fixed together by an adhesive.

24. The semiconductor laser module of claim 21, wherein the semiconductor laser holder and the optical wavelength conversion element holder are fixed together by YAG laser welding.

25. The semiconductor laser module of claim 21, comprising:

a stand which accepts the semiconductor laser holder and the optical wavelength conversion element holder for mounting thereon; and a collimating lens for adjusting the output of the optical wavelength conversion element and disposed on the stand.

* * * * *